(12) United States Patent
Mende

(10) Patent No.: US 6,836,107 B2
(45) Date of Patent: Dec. 28, 2004

(54) CONSTANT INPUT IMPEDANCE AC COUPLING CIRCUIT FOR A CURRENT PROBE SYSTEM

(75) Inventor: Michael J. Mende, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/649,563

(22) Filed: Aug. 26, 2003

(65) Prior Publication Data

US 2004/0100248 A1 May 27, 2004

Related U.S. Application Data

(60) Provisional application No. 60/428,648, filed on Nov. 22, 2002.

(51) Int. Cl.[7] .......................... G01R 33/07; G01R 15/20
(52) U.S. Cl. .................................... 324/117 H; 324/126
(58) Field of Search ......................... 324/117 H, 117 R, 324/126, 127, 99 R, 99 D, 251; 323/259, 368; 702/64

(56) References Cited

U.S. PATENT DOCUMENTS 3,525,041 A * 8/1970 Velsink .................. 324/117 R
3,573,616 A * 4/1971 Kahen .................... 324/117 H
4,639,665 A * 1/1987 Gary ..................... 324/117 H
5,146,156 A * 9/1992 Marcel ...................... 324/127
5,493,211 A * 2/1996 Baker .......................... 324/130

* cited by examiner

Primary Examiner—Ernest Karlsen
(74) Attorney, Agent, or Firm—William K. Bucher

(57) ABSTRACT

A constant input impedance AC coupling circuit for a current probe measurement system has a resistive-capacitive network that includes a capacitor for coupling the current output signal of a current measurement probe to the low input impedance measurement instrument and the resistive terminating element disposed in the measurement instrument. The resistive-inductive network includes a resistor and a synthesized inductor having a high inductive value, large current carrying capacity and an L/R time constant equal to the RC time constant of the resistive capacitive network. The resistive-inductive network is coupled to the resistive-capacitive network and receives the current output signal from the current measurement probe for terminating DC and low frequency signal components of the current output signal below the low frequency cutoff of the resistive-capacitive network in the same low input impedance of the measurement instrument.

4 Claims, 3 Drawing Sheets

CONSTANT INPUT IMPEDANCE AC COUPLING CIRCUIT FOR A CURRENT PROBE SYSTEM

CROSS-REFERENCE TO RELATED APPLICATION

This application claims the benefit of the U.S. Provisional Application No. 60/428,648, filed Nov. 22, 2002.

BACKGROUND OF THE INVENTION

The present invention relates generally to AC coupling circuits and more specifically to a constant input impedance AC coupling circuit for a current measurement probe.

Current probes measure the flux field generated by the movement of electrons through a conductor. The flux field surrounding the conductor is converted to a linear voltage output that can be displayed and analyzed on a measurement test instrument, such as an oscilloscope. One type of current probe is an AC only probe. AC only probes are configured with either a solid core or a split core and are passive devices that do not require external power. AC/DC current probes generally have a split core configuration and include a Hall Effect device for producing a voltage output in response to a DC generated flux field.

FIG. 1 illustrates a simplified AC/DC current probe system 10 based on the A6312 current probe, the AM503B Programmable Current Probe Amplifier and TM500 Power Module manufactured and sold by Tektronix Inc., Beaverton Oreg. The TM500 Power Module provides electrical power to the AM503B Programmable Current Probe Amplifier. As shown in FIG. 1, the current probe 12 has a split core 14 of magnetic material defining an aperture 16 through which a conductor 18 carrying a current to be measured extends. A multi-turn winding 20 is wrapped around one leg of the core 14. A thin film semiconductor Hall Effect device 22 is disposed within the magnetic core 14. A bias source 24 housed in the current probe amplifier 26 provides power for the Hall Effect device 22 via a multi-conductor cable 28. The Hall Effect device 22 provides a differential input signal to a Hall pre-amplifier 30 in the current probe amplifier 26 via the multi-conductor cable 28. The output of the Hall pre-amplifier 30 is applied to a power amplifier 32 that is provided with a feedback resistor 34. The output of the power amplifier 32 is connected via the multi-conductor cable 28 to one end of the multi-turn winding 20 and the opposite end of the winding 20 is connected via the multi-conductor cable 28 to a low input impedance scaling circuit 36. The input to the scaling circuit 36 is terminated by resistor 38 having a value of 25 ohms. An AC/DC switching circuit 40 is positioned between the non-inverting input terminal of a differential scaling amplifier 42 and the terminating-load resistor 38. The switching circuit 40 selectively couples an AC coupling capacitor 44 into the input line of the scaling amplifier 42. The output of the scaling amplifier 42 is into a 50 ohm environment which is coupled via a coaxial cable 46 to the 50 ohm input resistor 51 of the measurement test instrument 48, such as an oscilloscope. The front panel 50 of the current probe amplifier 26 includes buttons, knob, LEDs, numerical readout and input and output connectors for controlling the operation of the amplifier and coupling the current probe 12 and measurement test instrument 48 to the amplifier 26. Depressing the appropriate buttons on the current probe amplifier 26 apply signals to a controller 52 that selectively couple the DC or AC signal path the input of the scaling amplifier 42 and generates a digital output to a digital-to-analog converter 54 to vary the gain of the scaling amplifier 42.

The oscilloscope is set to DC coupling and 10 millivolts per division scale and coupled to the current probe amplifier 26 via the coaxial cable 46. The current probe 12 is coupled to the current probe amplifier 26 via the multi-conductor cable 28. An operator selects AC or DC coupling and the gain for the scaling amplifier 42 using the front panel 50 controls. The gain of the scaling amplifier 42 varies in a 1-2-5 sequence from 1 to 500 and is displayed on the numerical readout as current per division. The current carrying conductor is inserted through the aperture 16 of the split magnetic core 14. The high frequency component of the current in the primary conductor 18 results in a current being induced in the secondary winding 20 in a direction such as to generate a magnetic field in the core 14 that is opposed to the field created by the current in the primary conductor 18. The low frequency or DC component of the current in the primary conductor 18 is less effective at inducing current in the secondary winding 20, but generates a potential difference across the Hall Effect device 22, and the amplifier 32 provides a corresponding current in the winding 20. The direction of the current supplied by the amplifier 32 is such that the magnetic field created in the core by the current flowing through the winding 20 is opposite to the direction of the magnetic field created by the current in the primary conductor 18. Over a wide range of frequencies, the voltage developed across the load resistor 38 is representative of the current in the primary winding 20.

The voltage developed across the load resistor is coupled to the high impedance input of the scaling amplifier 42. The scaling amplifier 42 amplifiers the input voltage by the amount of gain set by the operator. The output signal of the amplifier 42 is coupled to the low input impedance input of the oscilloscope. The oscilloscope processes the signal from the current probe amplifier 26 and produces a trace on the oscilloscope display representing the current signal in the primary conductor 18. To determine the amplitude of the current signal, an operation estimates the amount of vertical deflection of the signal in vertical divisions of the oscilloscope, for example 1.5 divisions. The vertical division number is divided by scale setting of the oscilloscope (i.e. 10 mv/div) and multiplied by the current per division setting of the current probe amplifier 26 (e.g. 20 ma/div) to produce the amount of current flowing through the primary conductor 18.

What is needed is a current probe amplifier that allows the scaling circuitry of the measurement instrument to provide the current per division scaling for current measurements. This requires a current probe amplifier that couples the current output of the current probe directly into the low input impedance input of the measurement instrument while maintaining a constant input impedance.

SUMMARY OF THE INVENTION

Accordingly, the present invention is a constant input impedance AC coupling circuit for a current probe measurement system. The current probe measurement system has a current measurement probe generating a current output signal via transformer action with a current carrying signal conductor and a Hall Effect device disposed in the core of the transformer providing a DC or low component of the current carrying signal conductor. The constant input impedance AC coupling circuit couples the current output signal from the current measurement probe to a resistive terminating element of a low input impedance measurement instrument. The constant input impedance AC coupling circuit has a capacitor coupling the current output signal of the current measurement probe to the low input impedance measurement instrument. The capacitor forms part of a resistive-capacitive network that includes the resistive terminating element. The resistive-capacitive network has a low frequency cutoff, typically less than 10 hertz, and a RC time constant. A resistive-inductive network is coupled to the resistive-capacitive network and receives the current output signal from the current measurement probe for terminating DC and low frequency signal components of the current output signal below the low frequency cutoff of the resistive-capacitive network in the same low input impedance of the measurement instrument. The resistive-inductive network provides a current path for shunting the DC and low frequency signal components to prevent transformer saturation of the current measurement probe. The resistive-inductive network has a synthesized inductor with a high inductive value, large current carrying capacity and an L/R time constant equal to the RC time constant of the resistive capacitive network. In the preferred embodiment of the invention, the synthesized inductor is implemented as a generalized impedance converter in the form of a gyrator. In a further embodiment of the present invention, an isolation inductor maybe coupled in series with the synthesized inductor to isolate the resistive-inductive network from the AC coupling circuit at higher frequencies.

The objects, advantages and novel features of the present invention are apparent from the following detailed description when read in conjunction with appended claims and attached drawings.

DETAILED DESCRIPTION OF THE PREFERRED EMBODIMENT

Figure 1:
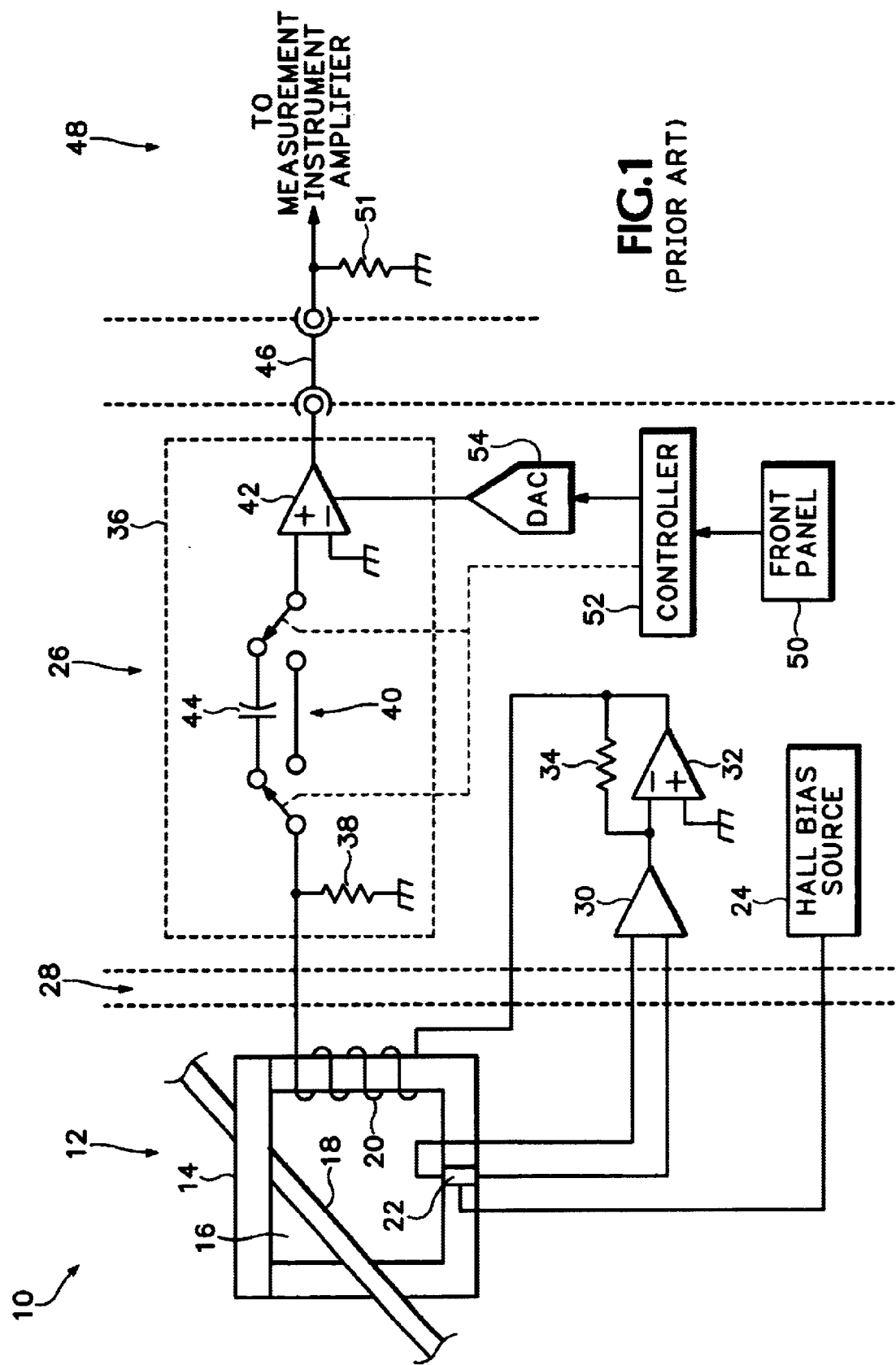
FIG. 1 is a prior art AC/DC current probe system illustrating the constant input impedance AC coupling circuit into a buffering amplifier.
Figure 2:
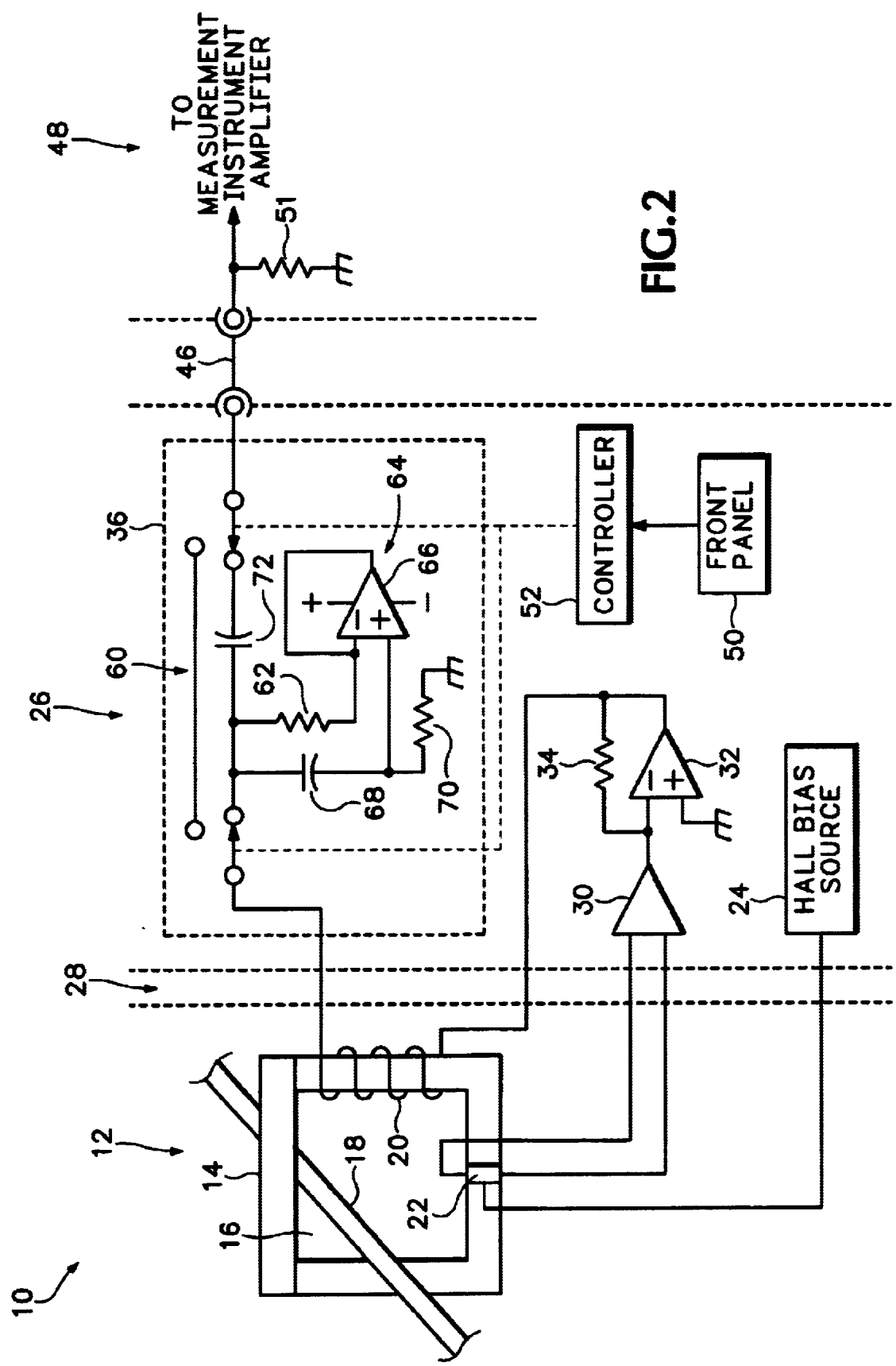
FIG. 2 is a representative schematic drawing of the constant input impedance AC coupling circuit for a AC/DC current probe system for a low impedance environment according to the present invention.

Referring to FIG. 2, there is shown the AC/DC current system incorporating the constant input impedance AC coupling circuit 60 of the present invention. Like elements from the previous drawing are labeled the same. The AC coupling circuit has a DC terminating shunt resistor 62 coupled to receive the current input from the current probe 12. The DC terminating shunt resistor 62 is coupled in series with a high inductive value synthesized inductor 64. The synthesized inductor 64 is preferably a generalized impedance converter commonly referred to as a gyrator. One implementation of a gyrator has an operational amplifier 66 having its inverting input node directly coupled to the output node of the amplifier. The DC terminating shunt resistor 62 is coupled to the inverting input node of the amplifier 66. The non-inverting node of the operation amplifier 66 is coupled to the junction between a shunt capacitor 68 that is coupled in parallel with the shunt resistor 62 and the synthesized inductor 64 and a termination resistor 70. The other end of the shunt capacitor 68 is coupled to receive the input from the current probe 12. The current signal is coupled through coupling capacitor 72 to the input of the measurement instrument 48. The controller 52 responds to AC/DC coupling commands initiated by the user from the front panel 50 to selectively couple the constant input impedance AC coupling circuit 60 into the current signal path.

The constant input impedance AC coupling circuit of the present invention couples the current signal from the current probe 12 into the low impedance environment of the measurement instrument 48 while maintaining a low frequency cut-off point and a constant impedance. The time constant of the shunt resistor 62 and the synthesized inductor 64 must be equal to the time constant of the termination resistance 51 of the measurement instrument 48 and the coupling capacitor 72 ($L_{shunt}/R_{shunt} = R_{output\ termination} \times C_{coupling}$). Variations between the two time constants will result in an inaccurate amplitude across $R_{output\ termination}$. If the termination resistor 70 is substantially larger than the DC terminating shunt resistor 62, then the impedance of the synthesized inductor 64 between the input and ground is $(R_{SHUNT}) + j\omega(R_{SHUNT})(R_{SHUNT\ L})(C_{SHUNT\ L})$. The inductance is the product of $(R_{SHUNT})(R_{SHUNT\ L})(C_{SHUNT\ L})$. In order to maintain a constant termination impedance as seen at the input node, the time constant $(R_{SHUNT})(R_{SHUNT\ L})(C_{SHUNT\ L})/R_{SHUNT}$ must be equal to $R_{output\ termination} \times C_{coupling}$. If $R_{SHUNT\ L}$ is not significantly larger than $R_{SHUNT}$ than the impedance of synthesized inductor between the input node and ground is:

$$[(R_{SHUNT}) + j\omega(R_{SHUNT})(R_{SHUNT\ L})(C_{SHUNT\ L})] / [j\omega(R_{SHUNT})(C_{SHUNT\ L}) + 1].$$

In current probe applications where the input current signal may be large, achieving equal or equivalent time constants for the resistive-capacitive and resistive-inductive networks in a low impedance environment requiring a low-frequency cut-off point, typically of 10 Hertz or less, places restrictions on the use of passive components. For example, in a fifty ohm environment where the termination resistor 51 in the measurement instrument 48 and the DC terminating shunt resistor 62 are 50 ohm, and the low frequency cut-off is 10 Hz, the size of the coupling capacitor $C_{coupling}$ needs to be 318 microfarads and the inductance of the shunt inductor $L_{shunt}$ needs to be 796 millihenrys. Because of the current carrying requirement of the inductor for current probe applications, the size of the inductor proves to be impractical. One solution is to couple a number of sized and valued inductors in series to form the shunt inductor. However, this increases the overall resistance of the final inductor while not meeting the power requirement. The synthesized inductor 64 provides the current carrying capacity required for current probe applications and sufficient inductance to maintain the constant termination in the 50 ohm low impedance environment while limiting the size of the inductor.

Figure 3:
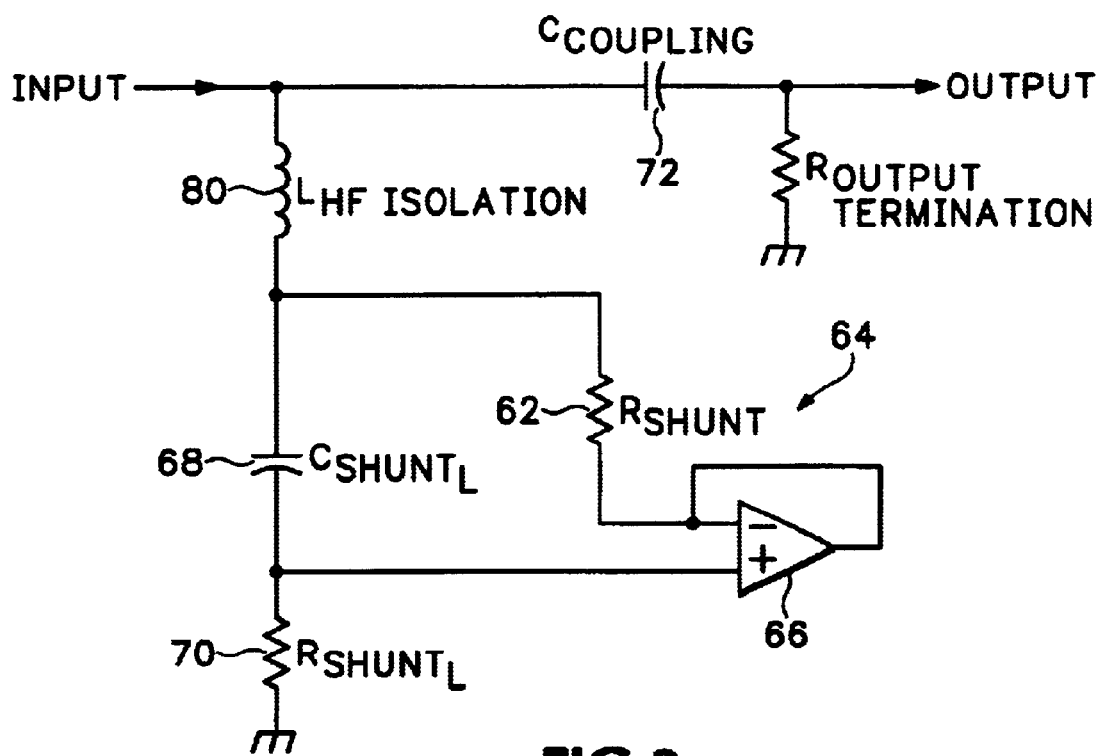
FIG. 3 is a further embodiment of the constant input impedance AC coupling circuit for a current measurement probe for a low impedance environment according to the present invention.

Referring to FIG. 3, there is shown a further embodiment of the constant input impedance AC coupling circuit 60 of the present invention. An inductor $L_{HF\ isolation}$ 80 is added in series with the synthesized inductor 64 to reduce and isolate high frequency effects caused by termination resistor 70 loading, stray capacitance at the junction of shunt capacitor 68 and termination resistor 70, and poor frequency response and phase shift through the operational amplifier 66. The isolation inductor 80 is sized accordingly to isolate the resistive-inductive network at higher frequencies. In a case where the series resistance of the isolation inductor 80 is large, an error voltage will be generated by the voltage divider made of the series resistance of the isolation inductor 80 and shunt resistor 70. The connection point of the shunt capacitor 68 can be moved from the shunt resistor 70 and isolation inductor junction to the opposite side of the isolation inductor 80 to remove the error voltage.

A constant input impedance AC coupling circuit for a current probe measurement system has been described having a resistive-capacitive network and a resistive-inductive network. The resistive-capacitive network includes a capacitor to couple the current output signal of a current measurement probe to the low input impedance measurement instrument and a resistive terminating element disposed in the measurement instrument. The resistive-inductive network includes a resistor and a synthesized inductor having a high inductive value, large current carrying capacity and an L/R time constant equal to the RC time constant of the resistive capacitive network. The resistive-inductive network is coupled to the resistive-capacitive network and receives the current output signal from the current measurement probe for terminating DC and low frequency signal components of the current output signal below the low frequency cutoff of the resistive-capacitive network in the same low input impedance of the measurement instrument.

It will be obvious to those having skill in the art that many changes may be made to the details of the above-described embodiments of this invention without departing from the underlying principles thereof. The scope of the present invention should, therefore, be determined only by the following claims.

What is claimed is:

1. In a current probe measurement system having a current measurement probe generating a current output signal via transformer action with a current carrying signal conductor and a Hall Effect device disposed in the core of the transformer, a constant input impedance AC circuit for coupling the current output signal from a current measurement probe to a resistive terminating element of a low input impedance measurement instrument comprising:

a capacitor coupling the current output signal of the current measurement probe to the low input impedance measurement instrument where the capacitor forms part of a resistive-capacitive network including the resistive terminating element, with the resistive-capacitive network having a low frequency cutoff and a RC time constant; and a resistive-inductive network having a synthesized inductor with a high inductive value, large current carrying capacity and an L/R time constant equal to the RC time constant of the resistive capacitive network coupled to receive the current output signal from the current measurement probe for terminating DC and low frequency signal components of the current output signal below the low frequency cutoff of the resistive-capacitive network in the same low input impedance of the measurement instrument and providing a current path for shunting the DC and low frequency signal components to prevent transformer saturation of the current measurement probe.

2. The constant input impedance AC coupling circuit as recited in claim 1 wherein the synthesized inductor comprises a generalized impedance converter.

3. The constant input impedance AC coupling circuit as recited in claim 1 wherein the generalized impedance converter comprises a gyrator.

4. The constant input impedance AC coupling circuit as recited in claim 1 an isolation inductor coupled between current output signal and the resistive-inductive network.

* * * * *